(12) United States Patent
Jiang et al.

(10) Patent No.: US 7,767,572 B2
(45) Date of Patent: Aug. 3, 2010

(54) METHODS OF FORMING A BARRIER LAYER IN AN INTERCONNECT STRUCTURE

(75) Inventors: Chong Jiang, Cupertino, CA (US); Anthony Chih-Tung Chan, Los Altos Hills, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/035,042

(22) Filed: Feb. 21, 2008

(65) Prior Publication Data

US 2009/0215260 A1 Aug. 27, 2009

(51) Int. Cl.
*H01L 21/44* (2006.01)
(52) U.S. Cl. .................... 438/597; 438/38; 438/584; 257/E21.046; 257/E21.056
(58) Field of Classification Search .......... 438/597, 438/38, 584, 678, 687, 672, 535; 257/751, 257/758, 760, E21.065, E21.046, E21.141
See application file for complete search history.

(56) References Cited

U.S. PATENT DOCUMENTS

| | | | |
|---|---|---|---|
| 5,824,599 A * | 10/1998 | Schacham-Diamand et al. | 438/678 |
| 5,976,928 A * | 11/1999 | Kirlin et al. | 438/240 |
| 6,002,175 A * | 12/1999 | Maekawa | 257/760 |
| 6,207,487 B1 | 3/2001 | Kim et al. | |
| 6,242,808 B1 | 6/2001 | Shimizu et al. | |
| 6,251,242 B1 | 6/2001 | Fu et al. | |
| 6,277,249 B1 | 8/2001 | Gopalraja et al. | |
| 6,284,646 B1 | 9/2001 | Leem | |
| 6,305,314 B1 | 10/2001 | Sneh et al. | |
| 6,335,240 B1 | 1/2002 | Kim et al. | |
| 6,344,419 B1 | 2/2002 | Forster et al. | |
| 6,348,376 B2 | 2/2002 | Lim et al. | |
| 6,358,829 B2 | 3/2002 | Yoon et al. | |
| 6,372,598 B2 | 4/2002 | Kang et al. | |
| 6,399,491 B2 | 6/2002 | Jeon et al. | |
| 6,416,822 B1 | 7/2002 | Chiang et al. | |
| 6,428,859 B1 | 8/2002 | Chiang et al. | |

(Continued)

OTHER PUBLICATIONS

Notice of Allowance for U.S. Appl. No. 12/041,804, dated Jul. 13, 2009.

(Continued)

*Primary Examiner*—Charles D Garber
*Assistant Examiner*—Abdulfattah Mustapha
(74) *Attorney, Agent, or Firm*—Patterson & Sheridan, LLP (57) ABSTRACT

Methods of forming a barrier layer for an interconnection structure are provided. In one embodiment, a method for forming an interconnect structure includes providing a substrate having a first conductive layer disposed thereon, incorporating oxygen into an upper portion of the first conductive layer, depositing a first barrier layer on the first conductive layer, and diffusing the oxygen incorporated into the upper portion of the first conductive layer into a lower portion of the first barrier layer. In another embodiment, a method for forming an interconnection structure includes providing a substrate having a first conductive layer disposed thereon, treating an upper surface of the first conductive layer with an oxygen containing gas, depositing a first barrier layer on the treated conductive layer, and depositing a second conductive layer on the first barrier layer while driving a portion of oxygen atoms from the treated conductive layer into the first barrier layer.

22 Claims, 5 Drawing Sheets

U.S. PATENT DOCUMENTS

| | | |
|---|---|---|
| 6,451,119 B2 | 9/2002 | Sneh et al. |
| 6,451,695 B2 | 9/2002 | Sneh |
| 6,458,701 B1 | 10/2002 | Chae et al. |
| 6,464,779 B1 | 10/2002 | Powell et al. |
| 6,468,924 B2 | 10/2002 | Lee et al. |
| 6,475,910 B1 | 11/2002 | Sneh |
| 6,478,872 B1 | 11/2002 | Chae et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,489,214 B2 | 12/2002 | Kim et al. |
| 6,511,539 B1 | 1/2003 | Raaijmakers |
| 6,534,395 B2 | 3/2003 | Werkhoven et al. |
| 6,548,424 B2 | 4/2003 | Putkonen |
| 6,551,929 B1 | 4/2003 | Kori et al. |
| 6,569,501 B2 | 5/2003 | Chiang et al. |
| 6,585,823 B1 | 7/2003 | Van Wijck |
| 6,599,572 B2 | 7/2003 | Saanila et al. |
| 6,607,976 B2 | 8/2003 | Chen et al. |
| 6,620,670 B2 | 9/2003 | Song et al. |
| 6,620,723 B1 | 9/2003 | Byun et al. |
| 6,620,956 B2 | 9/2003 | Chen et al. |
| 6,630,201 B2 | 10/2003 | Chiang et al. |
| 6,632,279 B1 | 10/2003 | Ritala et al. |
| 6,660,660 B2 | 12/2003 | Haukka et al. |
| 6,686,271 B2 | 2/2004 | Raaijmakers et al. |
| 2003/0059538 A1 | 3/2003 | Chung et al. |
| 2006/0205170 A1* | 9/2006 | Rinne .................... 438/381 |
| 2007/0209931 A1 | 9/2007 | Miller |
| 2007/0257369 A1* | 11/2007 | Huang .................... 257/758 |
| 2007/0292604 A1* | 12/2007 | Dordi et al. ............ 427/99.5 |

OTHER PUBLICATIONS

Response to Office Action for U.S. Appl. No. 12/041,804, dated Jun. 2, 2009.

Office Action for U.S. Appl. No. 12/041,804, dated Apr. 7, 2009.

U.S. Appl. No. 12/041,804, filed Mar. 4, 2008.

* cited by examiner

METHODS OF FORMING A BARRIER LAYER IN AN INTERCONNECT STRUCTURE

BACKGROUND OF THE INVENTION

1. Field of the Invention

The present invention generally relates to methods for forming a barrier layer on a substrate. More specifically, the present invention provides methods for forming a barrier layer for barrier applications in a metal interconnect structure.

2. Description of the Related Art

Interconnect structures of integrated circuits and semiconductor devices are typically fabricated by forming a series of dielectric layers and conductive layers in order to create a three dimensional network of conductive layers separated by dielectric material. The interconnect structure may be fabricated using, for example, a damascene structure in which a dielectric layer such as a low-k dielectric layer is formed atop one or more conductive plugs or sub-layers. In order to form an electrical connection to the conductive sub-layers, the dielectric layer is patterned and etched to define via openings therethrough. Formation of the openings within the dielectric layer exposes a portion of the conductive layer. Therefore, reliable formation of these interconnect features is an important factor in ensuring the quality, performance and reliability of devices formed on individual substrates and in each die.

The market for integrated circuits and semiconductor devices continually requires faster circuitry and greater circuit density, e.g., including millions of components on a single chip. As a result, the dimensions of the integrated circuit components shrink, and the choice of materials used to fabricate such components becomes increasingly important. For example, low resistivity metal interconnects, such as copper and aluminum, that provide conductive paths between the components on the integrated circuits, now require low dielectric constant layers, e.g., having a dielectric constant $\leq 4$, between the metal interconnects to provide insulating inter-metal layers that reduce capacitive coupling between adjacent metal lines, thereby enabling reliable performance at small line widths.

Interconnect structure fabrication may be achieved by a variety of techniques. A typical method for forming layers for interconnect structures includes physical vapor deposition of a barrier layer over a feature, such as a trench or a via, followed by physical vapor deposition of a metal layer on the barrier layer to fill the feature. Finally, after the deposited material layers, including the metal and the dielectric layers, are formed on the substrate, a planarization or an etching process is performed to define a conductive interconnect feature with desired dimension on the substrate.

Problems encountered during metal interconnect manufacturing processes include metal diffusion and metal layer peeling and voids. A non-conformal or non-uniform barrier layer may prevent the to-be-deposited metal layer from continuously and uniformly depositing on the barrier layer, thereby forming voids and defects in the interconnect structure and eventually leading to device failure. Metal atoms from the metal layers may diffuse into the adjacent dielectric layers during subsequent deposition and/or anneal processes, thereby deteriorating the electrical property of the devices. Accordingly, a conformal and robust barrier layer becomes increasingly important to prevent the metal atoms from diffusing into adjacent dielectric layers. Moreover, it is desirable for a barrier layer to have a high wettability to the metal layer to be deposited thereon to promote good adhesion between the barrier and metal layers, which prevents the metal layer from peeling and flaking.

Therefore, there is a need in the art for an improved barrier layer suitable for use in an interconnect structure.

SUMMARY OF THE INVENTION

Methods for depositing a robust and conformal barrier layer on a substrate are provided. In one embodiment, a method for forming an interconnect structure includes providing a substrate having a first conductive layer disposed thereon, treating an upper surface of the first conductive layer with an oxygen containing gas, depositing a first barrier layer by a PVD process on the treated conductive layer, and thermal processing the substrate.

In another embodiment, a method for forming an interconnection structure includes providing a substrate having a first conductive layer disposed thereon, treating an upper surface of the first conductive layer with an oxygen containing gas, depositing a first barrier layer on the treated conductive layer, and depositing a second conductive layer on the first barrier layer while driving a portion of oxygen atoms from the treated conductive layer into the first barrier layer.

In yet another embodiment, a method for forming an interconnect structure includes providing a substrate having a dielectric layer disposed on a first conductive layer, the dielectric layer having a via formed therein to expose a portion of an upper surface of the first conductive layer, wherein the first conductive layer is a copper layer, treating the exposed upper surface of the first conductive layer with an oxygen containing gas, depositing a first barrier layer within the via, the upper surface of the dielectric layer and the treated surface of the first conducive layer, and depositing a second conductive layer to fill the via formed within the dielectric layer.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present invention generally provide methods for depositing a barrier layer for barrier applications of a metal interconnect fabrication process. The method provides a barrier layer having good barrier properties, such as high density, high wetting ability and less defects, while maintaining resistivity at a desired range, thereby improving the integrity and reliability of the devices formed.

Figure 1A:
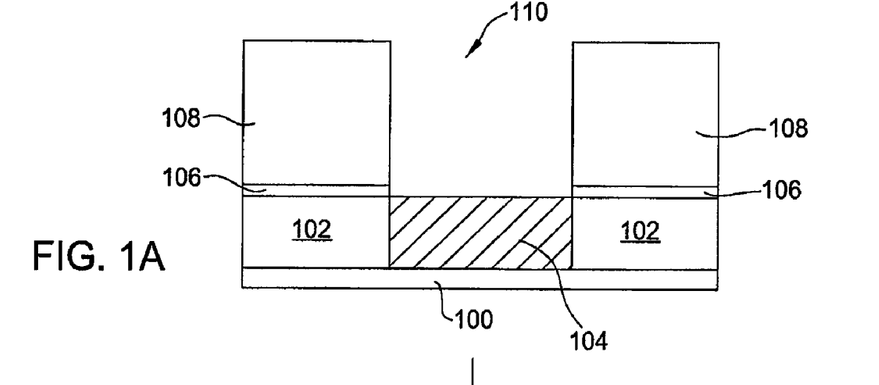
FIGS. 1A-C are sectional views of exemplary embodiments of forming interconnect structures.
Figure 1B:
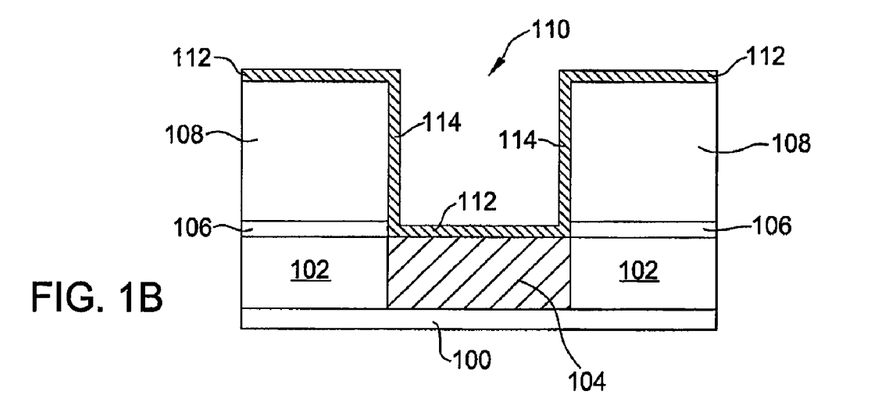
Figure 1C:
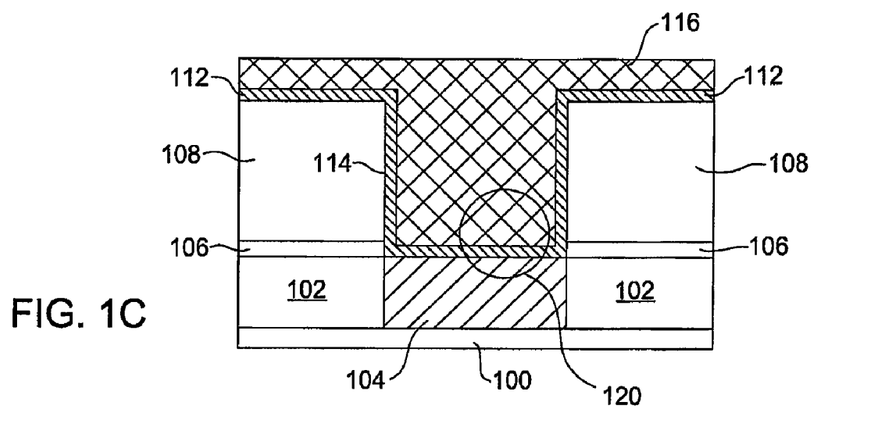

FIG. 1 depicts an exemplary embodiment of a barrier layer formed on a substrate 100 suitable for fabricating an interconnect structure. A dielectric bulk insulating layer 108 and an underlying dielectric barrier layer 106 are stacked on another previously formed interconnect with a first conductive layer 104 embedded in another dielectric bulk insulating layer 102. The first conductive layer 104 may comprise a metal material, such as copper, aluminum, tungsten, alloy thereof, and combinations thereof. As a via/trench etching process is completed and a via/trench 110 is defined in the dielectric bulk insulating layer 108, a barrier layer 112 may be deposited on the upper surface of the dielectric bulk insulating layer 108 and also bottom of the via/trench and sidewall 114 of the via/trench 110 defined within the dielectric bulk insulating layer 108, as shown in FIG. 1B. After the barrier layer 112 is deposited on the substrate 100, a second conductive metal layer 116 may be used to fill in the via/trench 110, thereby forming a metal interconnect structure on the substrate 100, as shown in FIG. 1C. The second conductive metal layer 116 may comprise copper, aluminum, tungsten, alloys thereof, and combinations thereof. In one embodiment, the barrier layer 112 may be formed from a metal containing material in accordance with the embodiments described in the present invention. Suitable examples of the metal containing material includes tantalum nitride (TaN), tantalum oxynitride (TaON), tantalum (Ta), titanium (Ti), titanium nitride (TiN), titanium oxynitride (TiON), and combinations thereof. In one embodiment, the barrier layer 112 may be in formed of a composite film that includes one or more layers. More details of the process and method of forming the barrier layer 112, as exaggerated in the circle 120, will be described further below with reference to FIGS. 3-6.

In one embodiment, the dielectric bulk insulating layers 108, 102 comprise a dielectric material having a dielectric constant less than 4.0 (e.g., a low-k material). Examples of suitable materials include carbon-containing silicon oxides (SiOC), such as BLACK DIAMOND® dielectric material available from Applied Materials, Inc., and other low-k polymers, such as polyamides. In the embodiment depicted in FIGS. 1A-C, the dielectric bulk insulating layer 108, 102 is typically a carbon-containing silicon oxide (SiOC) layer. The dielectric barrier layer 106 may have a dielectric constant of about 5.5 or less. In one embodiment, the dielectric barrier layer 106 may be a carbon containing silicon layer (SiC), a nitrogen doped carbon containing silicon layer (SiCN), or the like. In the embodiment depicted in FIGS. 1A-1C, the dielectric barrier layer is a SiCN film. An example of the dielectric barrier layer material is BLOK® dielectric material, available from Applied Materials, Inc.

Figure 2:
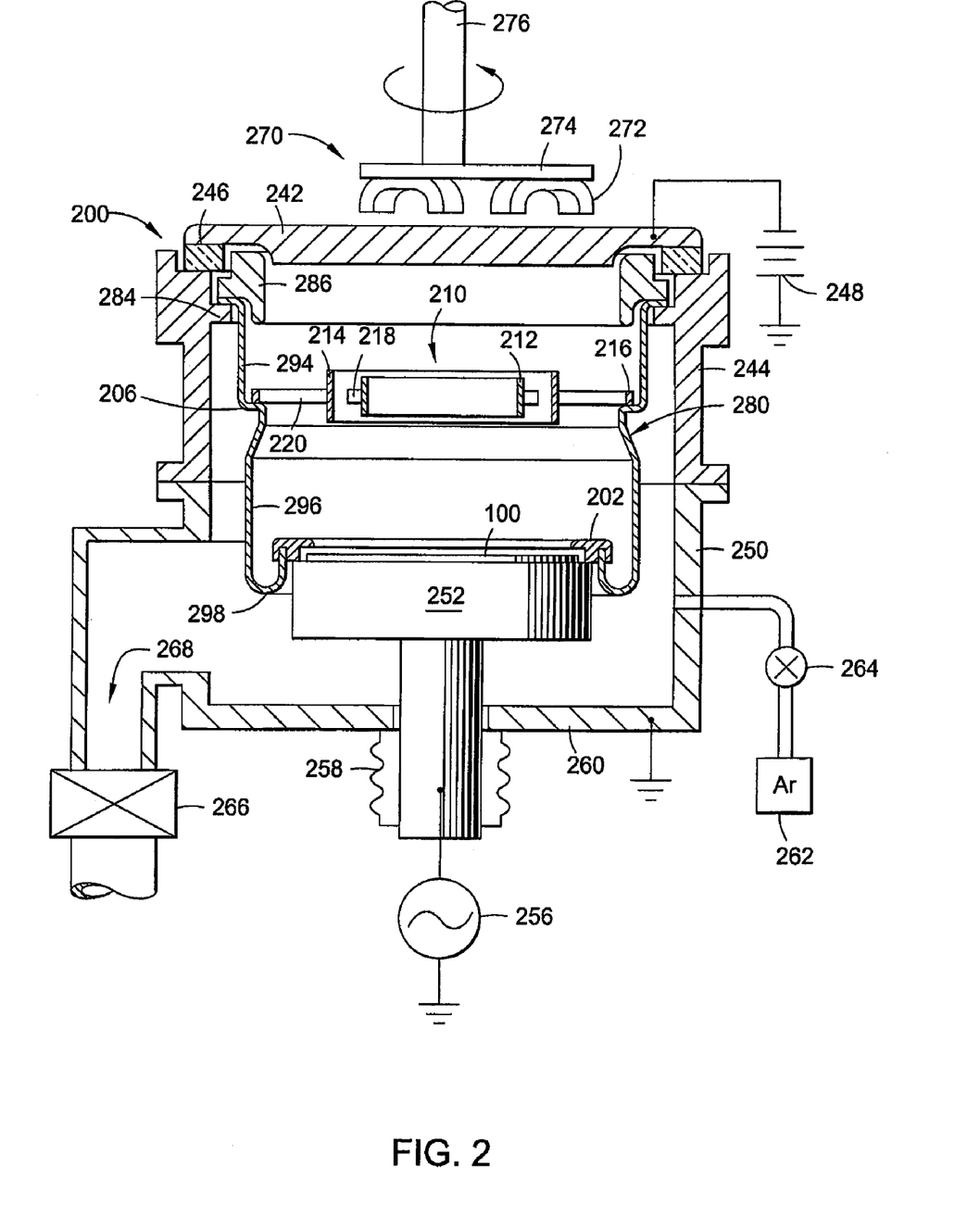
FIG. 2 is one embodiment of a physical vapor deposition chamber that may be used to practice depositing a barrier layer in accordance with one embodiment of the invention described herein.

FIG. 2 illustrates one embodiment of physical vapor deposition chamber 200 in which the invention may be practiced. Example of suitable PVD chambers include the ALPS® Plus and SIP ENCORE® PVD processing chambers, both commercially available from Applied Materials, Inc., Santa Clara, of Calif. It is contemplated that processing chambers available from other manufactures may also be utilized to perform the present invention.

In one embodiment, the processing chamber 200 contains a sputtering source, such as a target 242, and a substrate support pedestal 252 for receiving the substrate 100 thereon. The substrate support pedestal 252 is located within a grounded enclosure wall 250, which may be a chamber wall as shown or a grounded shield.

The target 242 is supported by a dielectric isolator 246 which is disposed between the target 242 and a grounded conductive aluminum adapter 244. The target 242 is comprised of a material to be deposited on the substrate 100 during sputtering, and may include titanium, tantalum, tungsten, aluminum, copper molybdenum, platinum, nickel, iron, niobium, palladium, alloys thereof, and combinations thereof. In one embodiment, the material of the target 242 may be selected from a group consisting of titanium, tantalum, tungsten, aluminum, copper, alloys thereof, and combinations thereof.

Figure 5:
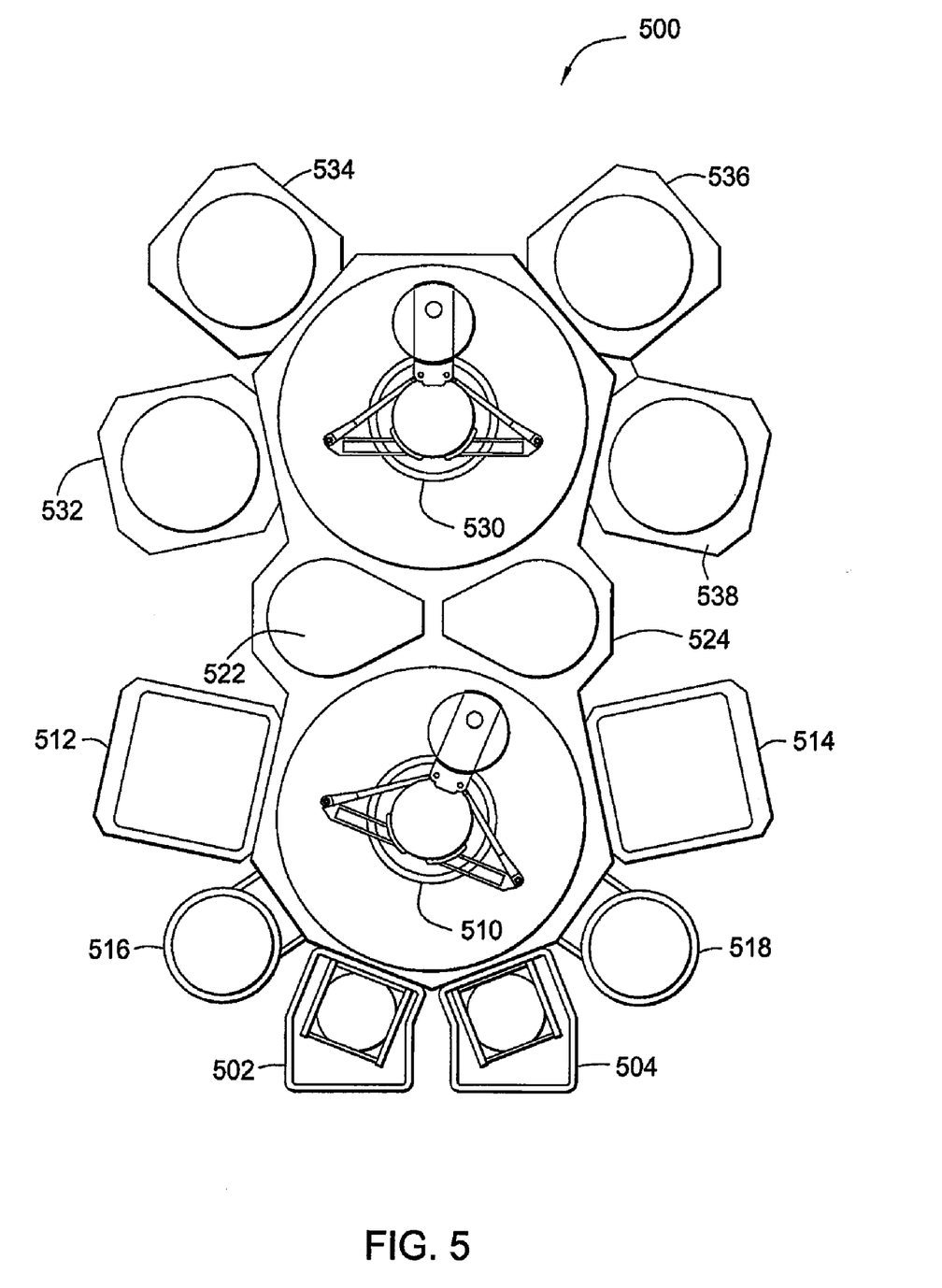
FIG. 5 is a schematic top view diagram of one example of a multi-chamber processing system which may be adapted to perform the process disclosed herein.

The substrate support pedestal 252 supports the substrate 100 to be sputter coated in planar position opposite to the principal face of the target 242. The substrate support pedestal 252 has a material-receiving surface facing the principal surface of the target 242. The substrate support pedestal 252 is vertically movable through a bellows 258 connected to a bottom chamber wall 260 to allow the substrate 100 to be robotically transferred onto the substrate support pedestal 252 through a load lock valve (not shown) in the lower portion of processing chamber 200 and thereafter raised to a deposition position as depicted in FIG. 5. Processing gas is supplied from a gas source 262 through a mass flow controller 264 into the lower part of the chamber 200.

A controllable DC power source 248 coupled to the chamber 200 may be used to apply a negative voltage or bias to the target 242. An RF power supply 256 may be connected to the substrate support pedestal 252 in order to induce a negative DC self-bias on the substrate 100. In other applications, the substrate support pedestal 252 may be grounded or left electrically floating.

A rotatable magnetron 270 is positioned in back of the target 242. The magnetron 270 includes a plurality of magnets 272 supported by a base plate 274. The base plate 274 connects to a rotation shaft 276 coincident with the central axis of the chamber 200 and the substrate 100. The magnets 272 produce a magnetic field within the chamber 200, generally parallel and close to the surface of the target 242 to trap electrons and increase the local plasma density, which in turn increases the sputtering rate. The magnets 272 produce an electromagnetic field around the top of the chamber 200, and magnets 272 are rotated to rotate the electromagnetic field which influences the plasma density of the process to more uniformly sputter the target 242.

The chamber 200 includes a grounded bottom shield 280 connected to a ledge 284 of the adapter 244. A dark space shield 286 is supported on the bottom shield 280 and is fastened to the shield 280 by screws or other suitable manner. Sufficient to allow the two shields 280, 286 to be grounded to the adapter 244. The adapter 244 in turn is sealed and grounded to the aluminum chamber sidewall 250. Both shields 280, 186 are typically formed from hard, non-magnetic stainless steel.

The bottom shield 280 extends downwardly in an upper tubular portion 294 of a first diameter and a lower tubular portion 296 of a second diameter. The bottom shield 280 extends along the walls of the adapter 244 and the chamber wall 250 to below until reaching a top surface of the substrate support pedestal 252. A cover ring 202 rests on the top of the upwardly extending inner portion 298 of the bottom shield 280 when the substrate support pedestal 252 is in its lower, loading position but rests on the outer periphery of the substrate support pedestal 252 when it is in its upper, deposition position to protect the substrate support pedestal 252 from sputter deposition. An additional deposition ring (not shown) may be used to shield the periphery of the substrate 100 from deposition.

The chamber 200 may also be adapted to provide a more directional sputtering of material onto a substrate. In one embodiment, directional sputtering may be achieved by positioning a collimator 210 between the target 242 and the substrate support pedestal 252 to provide a more uniform and symmetrical flux of deposition material to the substrate 100.

The collimator 210 rests on the ledge portion of the bottom shield 280, thereby grounding the collimator 210. The collimator 210 may be a metal ring and includes an outer tubular section and at least one inner concentric tubular sections, for example, three concentric tubular sections 212, 214, 216 linked by cross struts (not shown). The outer tubular section 216 rests on the ledge portion 206 of the bottom shield 280. The use of the bottom shield 280 to support the collimator 210 simplifies the design and maintenance of the chamber 200. At least the two inner tubular sections 212, 214 are of sufficient height to define high aspect-ratio apertures that partially collimate the sputtered particles. Further, the upper surface of the collimator 210 acts as a ground plane in opposition to the biased target 242, particularly keeping plasma electrons away from the substrate 100.

FIG. 5 is a schematic top-view diagram of an exemplary multi-chamber processing system 500 that includes at least one chamber 200 that may be adapted to perform the processes disclosed herein. Examples of multiple chamber processing systems include ENDURA®, CENTURA®, and PRODUCER® processing systems, commercially available from Applied Materials, Inc. Another similar multi-chamber processing system that may be adapted to benefit from the invention is disclosed in U.S. Pat. No. 5,186,718, entitled "Stage Vacuum Wafer Processing System and Method," issued on Feb. 16, 1993, which is incorporated by reference herein.

The system 500 generally includes load lock chambers 502, 504 for the transfer of substrates 100 into and out from the system 500. Since the system 500 is operated under vacuum, the load lock chambers 502, 504 may be "pumped down" to facilitate entry and egress of substrates to the system. A first robot 510 may transfer the substrate 100 between the load lock chambers 502, 504, processing chambers 512, 514, transfer chambers 522, 524, and other chambers 516, 518. A second robot 530 may transfer the substrate 100 between processing chambers 532, 534, 536, 538 and the transfer chambers 522, 524. Furthermore, each processing chamber 512, 514, 516, 518 may be outfitted to perform one or more substrate processing operations such as cyclical layer deposition including atomic layer deposition (ALD), chemical vapor deposition (CVD), physical vapor deposition (PVD), etch, pre-clean, de-gas, orientation and other substrate processes. Also, at least one of the chambers 512, 514, 516, 518, 532, 534, 536, 538 is configured as processing chamber 200 described above in FIG. 2.

The first robot 510 is used to transfer substrates 100 to and/or from one or more transfer chambers 522, 524. The transfer chambers 522, 524 are used to maintain ultrahigh vacuum conditions while allowing substrates to be transferred within the system 500. A second robot 530 may transfer the substrate 100 between the transfer chambers 522, 524 and a second set of one or more processing chambers 532, 534, 536, 538. Similar to processing chambers 512, 514, 516, 518, the processing chambers 532, 534, 536, 538 can be outfitted to perform a variety of substrate processing operations, such as cyclical layer deposition including atomic layer deposition (ALD), chemical vapor deposition (CVD), physical vapor deposition (PVD), etch, pre-clean, de-gas, and orientation. Any of the substrate processing chambers 512, 514, 516, 518, 532, 534, 536, 538 may be removed from the system 500 if not necessary for a particular process to be performed by the system 500.

The processing system 500 includes one or more preclean chambers to preclean the substrate transferring into the chambers and one or more PVD chambers configured to deposit barrier layers, seed layers or conductive metal layers. To enhance efficiency and throughput of the system, one configuration of the processing system includes two preclean chambers, such as preclean chambers 512, 514 configured to pre-clean the substrate surface, and four ALD or PVD chambers, such as processing chambers 532, 534, 536, 538, configured to deposit barrier layers or to deposit seed layers disposed in connection to the back-end central transfer chamber. In one embodiment, the processing chambers 532, 534, 536, 538 are configured to deposit at least one of metal tantalum (Ta), metal titanium (Ti), metal aluminum (Al), aluminum alloy, tantalum nitride (TaN), titanium nitride (TiN), tantalum oxynitride (TaON), titanium oxynitride (TiON) by a PVD process.

In an exemplary embodiment, the substrate 100 is transferred into at least one of the preclean chambers 512, 514 to preclean the surface of the substrate 100. Following the precleaning step, the substrate 100 is transferred into at least one of processing chambers 534, 536 to deposit the barrier layer 114, such as Ti, Ti/TiN/Ti, Ti/TiON/Ti, Ta, Ta/TaN/Ta, Ta/TaON/Ta, or the like on the substrate 100. The substrate is then transferred to at least one of processing chambers 532, 538 to fill the via/trench 110 on the substrate 100 with Al, Cu, W, or other conductive material.

In yet another exemplary embodiment, the substrate 100 is transferred into one of the preclean chambers 512, 514 to preclean the surface of the substrate 100. Following the precleaning step, the substrate 100 is transferred into at least one of the processing chambers 534, 536 to deposit the barrier layer 114, such as Ti, Ti/TiN/Ti, Ti/TiON/Ti, Ta, Ta/TaN/Ta, Ta/TaON/Ta, or the like on the substrate 100. After the barrier layer 114 is deposited, the substrate 100 may be transferred back to one of the precleaning chambers 512, 514 to perform an optional post treatment process. Alternatively, the post treatment process may be performed in any other treatment/annealing processing chamber incorporated in the system 500 or any other suitable systems and chambers capable of performing the treatment process. Subsequently, the substrate 100 may be further transferred to at least one of processing chambers 532, 538 to fill the via/trench 110 on the substrate 100 with Al, Cu, W, or other conductive material. Alternatively, the via/trench 110 may be filled in another chamber, such as a chamber configured for an electroplating (ECP) process, which may be disposed in system other than the system 500.

Figure 3:
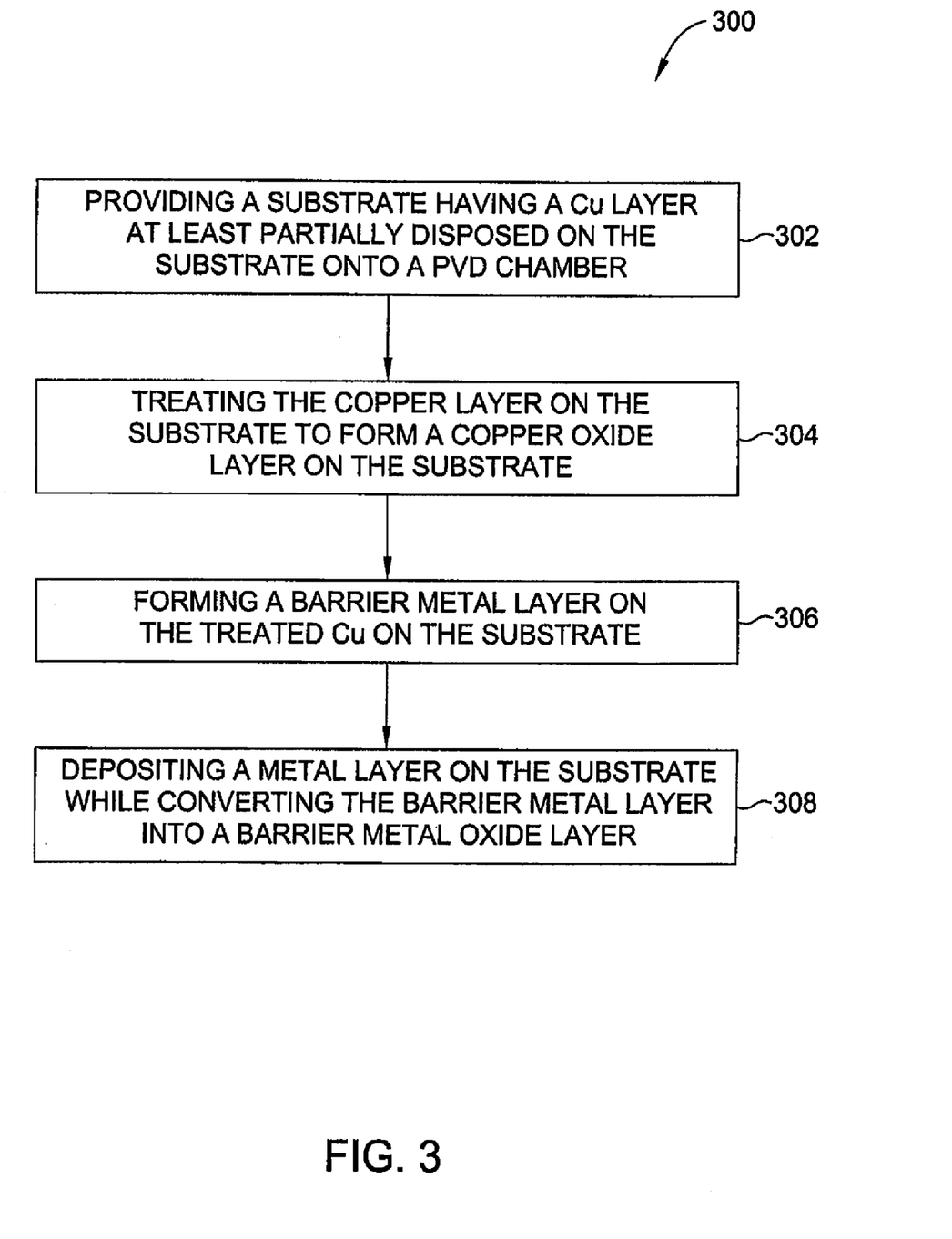
FIG. 3 is a flow diagram of one embodiment of a barrier layer formation metallization process according to one embodiment of the invention.

FIG. 3 depicts a flow diagram of one embodiment of a dielectric barrier layer formation process 300 according to one embodiment of the invention. FIGS. 4A-4E are schematic cross-sectional views illustrating the sequence of the barrier layer formation process 300. The process 300 may be performed in a plasma processing chamber, such as the processing chamber 200 depicted in FIG. 2 or other suitable deposition reactor.

Figure 4A:
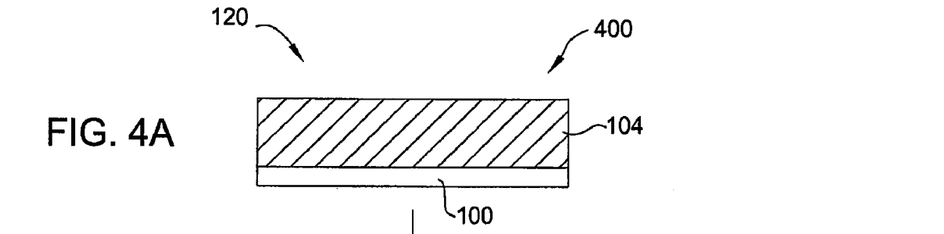
FIGS. 4A-4E are sectional views of one embodiment of an interconnect structure performed in accordance to the process described in FIG. 3.
Figure 4B:
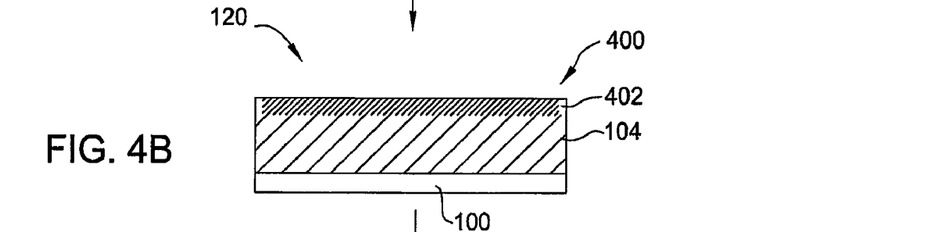

The process 300 begins at step 302 by providing the substrate 100 having a structure 400 previously manufactured and formed on the substrate 100, as shown in FIG. 4A. The structure 400 formed on the substrate 100 includes the first conductive layer 104, as indicated by the circle 120 shown in FIG. 1C and shown in more detail in FIGS. 4A-4E. In one embodiment, the conductive layer 104 may be a metal material, such as copper, aluminum, tungsten, alloy thereof, or combinations thereof. In the exemplary embodiment depicted in FIG. 4A, the conductive layer 104 is fabricated from copper or copper alloy. It is noted that the first conductive layer 104 may be laterally bounded by a dielectric layer, such as the dielectric bulk insulating layer 102, as shown in FIGS. 1A-1C.

At step 304, a treatment gas mixture is supplied into a processing chamber to treat the upper surface of the first conductive layer 104, thereby forming a treated layer 402 on the upper surface of the first conductive layer 104. In one embodiment, the treated layer 402 is formed on the topmost portion of the first conductive layer 104. The processing chamber used to perform the treatment process may be the processing chamber 200 as depicted in FIG. 2 or any other suitable processing chamber, such as a preclean chamber or a degas chamber. In one embodiment, the gas mixture supplied into the processing chamber is an oxygen containing gas. Suitable examples of the oxygen containing gas includes $O_2$, $N_2O$, $NO_2$, $NO$, $O_3$, and the like. The oxygen containing gas treats the first conductive layer upper surface, incorporating oxygen atoms supplied from the oxygen containing gas into the upper surface of the first conductive layer 104, thereby forming the oxygen treated layer 402 on the substrate 100. The oxygen atoms incorporated into the first conductive layer 104 may later be diffused to the adjacent layers, as will be further described below. In one embodiment, an inert gas or a carrier gas, such as Ar, He, $N_2$ or the like, may be supplied as part of the gas mixture to assist treating the conductive layer surface, while maintaining the chamber at a desired pressure range.

In one embodiment, the first conductive layer 104 may be plasma treated in a suitable chamber in the presence of an oxygen containing gas source. For example, the first conductive layer 104 may be treated in a preclean chamber, a degas chamber, a deposition chamber, or other kind of plasma chamber.

In one embodiment, the amount of the oxygen atoms incorporated into the conductive layer 104 may be determined by the duration of the treatment performed on the conductive layer surface. In an embodiment wherein more oxygen atoms are desired to be incorporated into the conductive layer 104, a longer treatment time may be performed. In one embodiment, the process time for treating the conductive layer surface may be between about 5 seconds and about 180 seconds, such as between about 30 seconds and about 60 seconds. In the embodiment wherein the oxygen atoms are desired to be incorporated deeper below the upper surface of the conductive layer 104, a greater amount of oxygen gas may be supplied into the processing chamber to treat the surface of the conductive layer. The presence of the oxygen atoms incorporated into the conductive layers surface may be detected by measuring the surface reflectivity of the conductive layer 104. The change in the reflectivity of the surface of the conductive layer is indicative of the formation of an oxidized layer. In one embodiment, the surface reflectivity of the conductive layer 104 reduces from 120 percent to about 108 percent, as relatively to silicon, after the oxidation treatment process. It is noted that the greater amount of oxygen atoms treated into the conductive layer 104, the lower surface reflectivity, as compared to an untreated reflective metal layer, is obtained.

Several process parameters are regulated while performing the oxygen gas treatment process at step 304. In one embodiment, a pressure of the gas mixture in the preclean chamber is regulated between about 0 Torr to about 500 Torr, for example, between about 0 Torr to about 10 Torr. The substrate temperature is maintained between about 50 degrees Celsius and about 400 degrees Celsius, for example, between about 100 degrees Celsius and about 350 degrees Celsius, such as about 250 degrees Celsius. The oxygen containing gas, such as $O_2$ gas, may be provided at a flow rate between about 1000 sccm to about 1500 sccm. The inert gas, such as Ar, may be provided at a flow rate between about 0 sccm to about 10000 sccm.

Figure 4C:
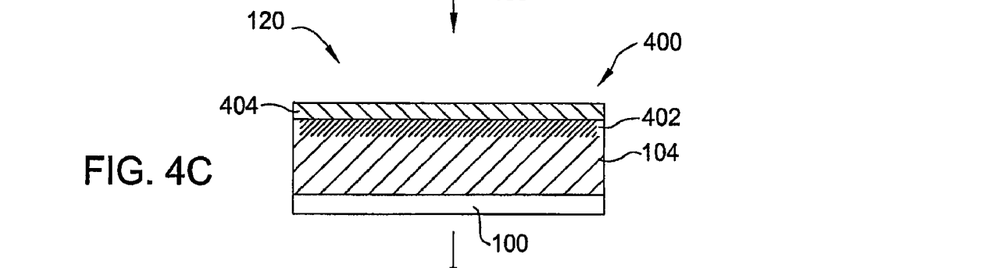

At step 306, the substrate 100 is transferred, if necessary, to a deposition chamber, such as the deposition chamber 200 shown in FIG. 2 or one of the other deposition chambers of the system 500 shown in FIG. 5, to perform a sputter deposition process on the substrate. The sputter deposition deposits a first barrier layer 404 on the substrate 100, as shown in FIG. 4C, similar to the barrier layer 112 shown in FIG. 1.

In one embodiment, the first barrier layer 404 may be a metal containing layer. Suitable examples of the metal containing layer include tantalum (Ta), titanium (Ti), tantalum nitride (TaN), tantalum oxynitride (TaON), titanium nitride (TiN), titanium oxynitride (TiON), or combinations thereof. In an exemplary embodiment depicted in FIG. 4C, the first barrier layer 404 is a titanium (Ti) or a tantalum (Ta) layer.

During the sputtering deposition process, a deposition gas mixture may be supplied into the process chamber 200 to react with the source material sputtered from the target 242. As a high voltage power is supplied to the metal target 242 and the substrate support pedestal 252 during sputtering, the metal source material is therefore sputtered from the target 242. The bias power applied between the target 242 and the substrate support pedestal 252 maintains a plasma formed from the deposition gas mixture in the process chamber 200. The ions mainly from the deposition gas mixture in the plasma bombard and sputter off material from the target 242, forming the metal barrier layer 404 on the substrate 100. In one embodiment, the deposition gas mixture may include reactive gas, non-reactive gas, inert gas, and the like. Examples of reactive gas include, but not limited to, $O_2$, $N_2$, $N_2O$, $NO_2$, and $NH_3$, $H_2O$, among others. Examples of non-reactive gas and/or inert gas include, but not limited to, Ar, He, Xe, and Kr, among others. In the embodiment wherein the barrier layer 404 is configured to be a metal titanium (Ti) or a metal tantalum (Ta) layer, the material of the target is configured to be a titanium (Ti) metal or a tantalum (Ta) metal target, and the deposition gas mixture supplied into the chamber may include a non-reactive gas or an inert gas, such as Ar. The material of the target and the gas mixture supplied during sputter deposition may be varied in accordance with different process requirements.

In one embodiment, the deposition gas mixture supplied into the processing chamber 200 at step 306 includes Ar gas at a flow rate between about 0 sccm and about 1000 sccm. RF power is applied to the target 242 during processing. In one embodiment, the RF power density may be supplied between about 0 milliWatts per centimeter square and about 5000 milliWatts per centimeter square. Alternatively, the DC power may be supplied between about 0 milliWatts per centimeter square and about 5000 milliWatts per centimeter square.

Several process parameters may be regulated at step 306. In one embodiment, a pressure of the deposition gas mixture in the process chamber 100 is regulated between about 0 mTorr and about 100 mTorr. The substrate temperature may be maintained between about 20 degrees Celsius and about 500 degrees Celsius. The processing time may be a predetermined processing period or after a desired thickness of the first barrier layer 404 is deposited on the substrate 100. In one embodiment, the process time may be between about 10 seconds and about 600 seconds.

Figure 4D:
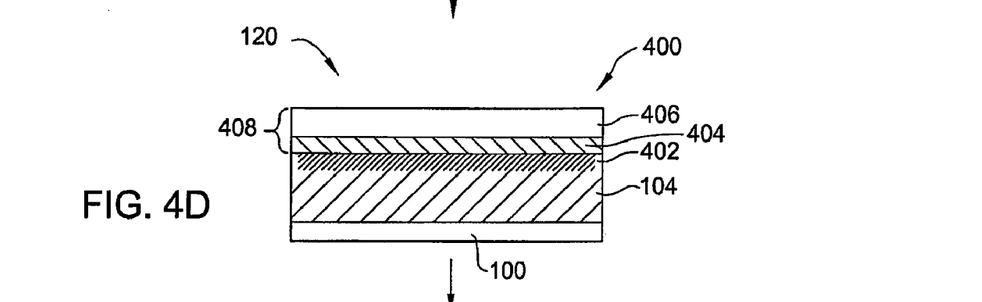
Figure 4E:
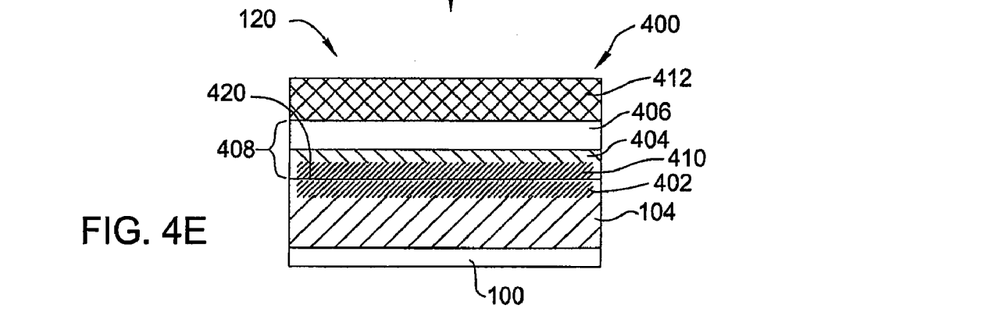

Alternatively, the barrier layer 112 deposited on the substrate 100 may have one or more layers, such as a composite film 408 shown in FIG. 4D. In one embodiment, the barrier layer 112 may be in form of a composite film 408, having a first barrier layer 404 and a second barrier layer 406 deposited on the first barrier layer 404. The second barrier layer 406 may be selected from a material having a good adhesion and/or wetting ability to both the underlying first barrier layer 404 and to the upper material to be deposit, such as a second metal layer 412 which will be described further below with referenced to FIG. 4E. The high adhesion or wetting ability for the second barrier layer 406 to the to-be-deposited second metal conductive layer 412 prevents the film structure 400 from peeling off or cracking during subsequent deposition processes. In the embodiment wherein the first barrier layer 404 is selected from a material having good adhesion and/or wetting ability to both the underlying first conductive layer 404 and the upper to-be-deposited second metal conductive layer 412, the second barrier layer 406 may be eliminated, if desired.

In one embodiment, both the second barrier layer 406 and the first barrier layer 404 may be deposited by the sputter deposition described in step 306. Alternatively, the second barrier layer 406 and the first barrier layer 404 may be each deposited by different processes and/or in different processing chambers. For example, the first barrier layer 404 may be deposited by the sputter deposition process as described in step 306 and the second barrier layer 406 may be deposited by a deposition process different than the sputter deposition process of step 306, such as an ALD process, CVD process, or other suitable process. Alternatively, the deposition process for depositing the first barrier layer 404 and the second barrier layer 406 may be deposited by the same technique or arranged as needed. In the embodiment depicted in FIG. 4D, the first barrier layer 404 may be a metal titanium containing (Ti) or a metal tantalum containing (Ta) film, and the second barrier layer 406 may be a nitrogen containing metal, an oxygen containing metal, and/or a nitrogen and oxygen containing metal layer, such as tantalum nitride (TaN), tantalum oxynitride (TaON), titanium nitride (TiN), titanium oxynitride (TiON), or combinations thereof.

In yet another embodiment, the barrier layer 112 may include multiple layers, such as including at least three layers. For example, the barrier layer 112 may further have a third barrier layer (not shown in FIGS. 4A-E) disposed on the second barrier layer 406, resulting in the second barrier layer 406 being sandwiched between the first barrier layer 404 and the third barrier layer. The third barrier layer may be selected from a metal titanium containing (Ti) or a metal tantalum containing (Ta) film. In the embodiment wherein a third barrier layer is present, the first and the second barrier layer are configured to be a tantalum nitride containing (TaN) or titanium nitride (TiN) containing film respectively.

At step 308, a second metal layer 412 is deposited on the second barrier layer 406 on the substrate 100 to form the metal interconnection structure on the substrate 100. The second metal layer 412 may be a metal material such as copper (Cu), aluminum (Al), tungsten (W), alloys thereof, or combinations thereof. The second metal layer 412 may be deposited by any suitable manner, such as electroplating, CVD, PVD, ALD, or the like.

In one embodiment, the process of depositing the second metal layer 412 is performed at a temperature sufficiently high enough to assist the oxygen atoms incorporated within the treated layer 402 to diffuse into the upper adjacent first barrier layer 404, thereby converting a lower portion 410 of the first barrier layer 404 into an oxygen containing metal layer. The thermal energy provided during the metal layer deposition process at step 308 assists driving the oxygen atoms accumulated on the treated layer 402 of the first conductive layer 104 into the lattice space in the lower portion of the first barrier layer 404, forming a oxygen containing barrier layer 410, such as a metal oxide layer, that is in contact with the treated layer 402 of the first conductive layer 104. As the oxygen atoms diffused into the first barrier layer 404 may repair some pinpoints, defect voids or vacant lattice structure existing in the first barrier layer 404, a robust interface 420, e.g., the oxygen containing barrier layer 410 and the treated layer 402, having a higher film density and good barrier properties is formed. The interface 420 formed between the first conductive layer 104 and the first barrier layer 404 prevents the underlying metal atoms of the first conductive layer 104 from diffusing into adjacent and upper second barrier layer 406, second conductive layer 412 and/or adjacent dielectric layers. It is noted that diffusion of the oxygen atoms is controlled to occur at the interface 420 rather than laterally diffusing to sidewalls that contact the trench or via defined within the dielectric layers, thereby preventing the via/trench resistivity from being adversely increased during the oxygen containing metal formation process.

In one embodiment, the second metal conductive layer deposition process is performed at a temperature greater than about 200 degrees Celsius, such as greater than 300 degrees Celsius, for example, between about 400 degrees Celsius and about 450 degree Celsius. In the embodiment depicted in FIG. 4E, the second conductive metal layer 412 is an aluminum layer (Al) deposited by a sputter PVD process, similar to the sputter PVD process described in step 306, which may be performed at a temperature of about greater than 200 degrees Celsius. The second metal conductive layer deposition time may affect the thickness of the aluminum layer. Additionally, the second metal conductive layer deposition time may affect the amount of oxygen atoms diffused into the first barrier layer 404. Furthermore, the amount of the oxygen atoms previously driven into the first conductive layer 104 at step 304 may also affect the number of the oxygen atoms being driven into the first barrier layer 404 during the second metal conductive layer deposition process. In one embodiment, the second metal conductive layer deposition time is controlled between about 10 seconds and about 80 seconds, such as about 45 seconds. In another embodiment, the second conductive layer deposition time is long enough for the second conductive layer 412 to reach a thickness between about 300 Å and about 5000 Å. Alternatively, the amount of oxygen desired in the first barrier layer 404 may be controlled by the treatment time of the first conductive layer 104 performed at step 304.

In one embodiment, a temperature ramp process may be performed prior to the second metal deposition process to stabilize the substrate temperature positioned in the processing chamber. During processing, the substrate temperature transferred into the processing chamber is elevated from a room temperature to a desired processing temperature. Therefore, prior to the substrate temperature reaching the desired processing temperature set for second metal deposition process, the temperature ramp process may be performed to elevate the substrate temperature. The temperature ramp process allows the substrate temperature to be steadily elevated to the desired processing temperature prior to the deposition process. During the temperature ramp processing, a process gas may be supplied into the processing chamber to assist temperature circulation within the processing chamber. In one embodiment, the gas supplied in the temperature ramp process includes $O_2$, $N_2$, Ar, He, $N_2O$, $H_2O$, $NO_2$, $NH_3$, and the like. In one embodiment, during substrate temperature elevation of the temperature ramp process, the oxygen atoms incorporated within the treated layer 402 may be gradually diffuse into the upper adjacent first barrier layer 404. It is found that the oxygen atoms may begin to diffuse into the lower portion of the first barrier layer 404 when the substrate temperature is about 150 degrees Celsius, such as about 200 degrees Celsius.

In one particular embodiment, the second conductive layer deposition process may be performed using a two step deposition process. In one embodiment, a room temperature metal deposition process may be performed to deposit a metal seed layer on the second barrier layer 406 prior to the second metal layer deposition process. The metal seed layer promotes the interface adhesion, thereby assisting depositing the second metal layer with higher thickness on top of the second barrier layer 406. In one embodiment, the metal seed layer may be formed at a room temperature. In another embodiment, the metal seed layer may be formed at other temperatures as needed.

EXAMPLES

In an exemplary embodiment, the first conductive layer 104 is a copper layer (Cu). Subsequently, an oxygen treatment process is performed to form a copper oxide layer 402 on the surface of the copper layer 104. A deposition process is then performed to sputter deposit a titanium layer (Ti) and/or a tantalum (Ta) layer as a first barrier layer 404 on the oxygen treated copper layer 402. Afterwards, a second barrier layer 406, such as a titanium nitride layer (TiN) and/or a tantalum nitride (TaN) layer is deposited on the first barrier layer 404. Optionally, a third barrier layer, such as a titanium layer (Ti) and/or a tantalum (Ta) layer, may be deposited on the second barrier layer 406. Subsequently, a second conductive layer 412, such as an aluminum layer (Al), is deposited on the substrate 100 while simultaneously diffusing the oxygen atoms incorporated in the copper oxide layer 402 into the lower portion of the first barrier layer 402, thereby forming an metal oxide layer, such as a titanium oxide layer (TiO) and/or a tantalum oxide (TaO) layer that improves the barrier properties formed in the interconnection structure. In this embodiment, a copper (Cu) and aluminum (Al) hybrid interconnect structure with improved and robust barrier application is accordingly formed on the substrate. The copper (Cu) and aluminum (Al) hybrid interconnection structure may be used in flash memory backend interconnection (BEOL) process.

Thus, methods of forming a barrier layer for an interconnection structure are provided. The improved barrier layer advantageously provides a high density and good barrier film properties while maintaining resistance of the barrier layer within a desired range. Additionally, the methods also reduce overall manufacture cost while enhancing throughput, thereby efficiently improving the product cycle time and production efficiency.

While the foregoing is directed to embodiments of the present invention, other and further embodiments of the invention may be devised without departing from the basic scope thereof, and the scope thereof is determined by the claims that follow.

What is claimed is:

1. A method of forming an interconnect structure on a substrate, comprising:
   providing a substrate having a first conductive layer disposed thereon;
   incorporating oxygen into an upper portion of the first conductive layer;
   depositing a barrier layer on the first conductive layer, wherein the first barrier layer comprises a metal containing layer; and
   diffusing the oxygen incorporated in the upper portion of the first conductive layer into a lower portion of the barrier layer, wherein diffusing the oxygen comprises converting the lower portion of the metal containing layer into an oxygen containing metal layer.

2. The method of claim 1, wherein incorporating oxygen further comprises:
   treating an upper surface of the first conductive layer with an oxygen containing gas.

3. The method of claim 2, wherein diffusing the oxygen further comprises:
   providing thermal energy to assist oxygen incorporated in the upper portion of the first conductive layer while depositing a second conductive layer on the first barrier layer at a temperature greater than about 200 degrees Celsius.

4. The method of claim 3, wherein depositing the second conductive layer comprises:
   driving oxygen atoms from the oxygen containing gas into the first barrier layer while depositing the second conductive layer.

5. The method of claim 1, wherein the metal containing layer is selected from a group consisting of metal tantalum containing layer, metal titanium containing layer and alloys thereof.

6. The method of claim 5, wherein depositing the barrier layer comprises:
   depositing a first barrier layer comprising the metal containing layer on the first conductive layer; and
   depositing a second barrier layer on the first barrier layer.

7. The method of claim 1, wherein the oxygen containing metal layer of the first barrier layer comprises at least one of tantalum oxynitride (TaON) or titanium oxynitride (TiON).

8. The method of claim 6, wherein depositing the barrier layer further comprises:
   depositing a third barrier layer on the second barrier layer.

9. The method of claim 8, wherein the third barrier layer is selected from a group consisting of metal tantalum containing layer, metal titanium containing layer and alloys thereof.

10. The method of claim 8, wherein the first and the second conductive layer are selected from a group consisting of Cu, Al, W, combinations thereof and alloys thereof.

11. The method of claim 3, further comprising:
    depositing a conductive seed layer prior to depositing the second conductive layer.

12. The method of claim 4, wherein the oxygen containing gas is selected from a group consisting of $O_2$, $N_2O$, $NO_2$, NO and $O_3$.

13. The method of claim 3, wherein the first conductive layer is a copper layer and the second conductive layer is an aluminum layer.

14. A method of forming an interconnect structure on a substrate, comprising:
    providing a substrate having a first conductive layer disposed thereon;
    treating an upper surface of the first conductive layer with an oxygen containing gas;
    depositing a barrier layer on the treated conductive layer, wherein the first barrier layer comprises a metal containing layer; and
    depositing a second conductive layer on the barrier layer while driving a portion of oxygen atoms from the treated conductive layer into the first barrier layer to convert the lower portion of the metal containing layer into an oxygen containing metal layer.

15. The method of claim 14, wherein the second conductive layer is deposited at a temperature greater than about 200 degrees Celsius.

16. A method of forming an interconnection structure on a substrate, comprising:
   providing a substrate having a dielectric layer disposed on a first conductive layer, the dielectric layer having a via formed therein to expose a portion of an upper surface of the first conductive layer, wherein the first conductive layer is a copper layer;
   treating the exposed upper surface of the first conductive layer with an oxygen containing gas to incorporate oxygen atoms into the first conductive layer;
   depositing a first barrier layer within the via, the upper surface of the dielectric layer and the treated surface of the first conducive layer, wherein the barrier layer comprises a metal containing layer; and
   depositing a second conductive layer to fill the via formed within the dielectric layer, wherein depositing the second conductive layer comprises converting a lower portion of the metal containing layer of the barrier layer into an oxygen containing metal layer by driving the oxygen atoms from the treated first conductive layer into the metal containing layer.

17. The method of claim 16, wherein the oxygen containing metal layer of the barrier layer is selected from a group consisting of tantalum oxynitride (TaON) and titanium oxynitride (TiON).

18. The method of claim 16, wherein the first conductive layer is a copper layer and the second conductive layer is an aluminum layer.

19. The method of claim 16, wherein the second conductive layer is deposited at a temperature greater than 250 degrees Celsius.

20. The method of claim 16, wherein the depositing the barrier layer comprises:
   depositing a first barrier layer comprising the metal containing layer within the via, the upper surface of the dielectric layer and the treated surface of the first conducive layer; and
   depositing a second barrier layer on the first barrier layer, wherein the first metal containing layer is selected from a group consisting of metal tantalum containing layer, metal titanium containing layer and alloys thereof, and the second barrier layer selected from a group consisting of tantalum nitride (TaN), tantalum oxynitride (TaON), titanium nitride (TiN), titanium oxynitride (TiON), and combinations thereof.

21. The method of claim 20, wherein the depositing the barrier layer further comprises depositing a third barrier layer on the second barrier layer, and the third barrier layer is selected from a group consisting of metal tantalum containing layer, metal titanium containing layer and alloys thereof.

22. The method of claim 6, wherein the second barrier layer is selected from a group consisting of tantalum nitride (TaN), tantalum oxynitride (TaON), titanium nitride (TiN), titanium oxynitride (TiON), and combinations thereof.

* * * * *

UNITED STATES PATENT AND TRADEMARK OFFICE
CERTIFICATE OF CORRECTION

PATENT NO. : 7,767,572 B2  Page 1 of 1
APPLICATION NO. : 12/035042
DATED : August 3, 2010
INVENTOR(S) : Jiang et al.

It is certified that error appears in the above-identified patent and that said Letters Patent is hereby corrected as shown below:

In the Claims:

Column 12, Claim 3, Line 17, please delete "first";

Column 12, Claim 4, Line 23, please delete "first";

Column 12, Claim 7, Line 35, please delete "first";

Column 12, Claim 10, Line 44, please delete "8" and insert --3-- therefor;

Column 13, Claim 16, Line 17, please delete "first".

Signed and Sealed this
Fourth Day of January, 2011

David J. Kappos
*Director of the United States Patent and Trademark Office*